(12) United States Patent
Kraft et al.

(10) Patent No.: US 7,319,256 B1
(45) Date of Patent: Jan. 15, 2008

(54) SHIELDED GATE TRENCH FET WITH THE SHIELD AND GATE ELECTRODES BEING CONNECTED TOGETHER

(75) Inventors: Nathan Kraft, Pottsville, PA (US); Christopher Boguslaw Kocon, Mountaintop, PA (US); Paul Thorup, West Jordan, UT (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 11/471,279

(22) Filed: Jun. 19, 2006

(51) Int. Cl.
H01L 29/76 (2006.01)
H01L 29/94 (2006.01)
H01L 31/062 (2006.01)
H01L 31/113 (2006.01)
H01L 31/119 (2006.01)

(52) U.S. Cl. ............... 257/330; 257/331; 257/E29.201

(58) Field of Classification Search ........... 257/330, 257/331, 332, E27.091, E29.201, E21.655
See application file for complete search history.

(56) References Cited

U.S. PATENT DOCUMENTS

| | | | |
|---|---|---|---|
| 3,404,295 A | 10/1968 | Warner et al. |
| 3,412,297 A | 11/1968 | Amlinger |
| 3,497,777 A | 2/1970 | Teszner et al. |
| 3,564,356 A | 2/1971 | Wilson |
| 3,660,697 A | 5/1972 | Berglund et al. |
| 4,003,072 A | 1/1977 | Matsushita et al. |
| 4,011,105 A | 3/1977 | Paivinen et al. |
| 4,300,150 A | 11/1981 | Colak |
| 4,324,038 A | 4/1982 | Chang et al. |
| 4,326,332 A | 4/1982 | Kenney |
| 4,337,474 A | 6/1982 | Yukimoto |
| 4,338,616 A | 7/1982 | Bol |
| 4,345,265 A | 8/1982 | Blanchard |
| 4,445,202 A | 4/1984 | Goetze et al. |
| 4,568,958 A | 2/1986 | Baliga |
| 4,579,621 A | 4/1986 | Hine |
| 4,636,281 A | 1/1987 | Buiguez et al. |
| 4,638,344 A | 1/1987 | Cardwell, Jr. |
| 4,639,761 A | 1/1987 | Singer et al. |

(Continued)

FOREIGN PATENT DOCUMENTS

CN 1036666 A 10/1989

(Continued)

OTHER PUBLICATIONS

B.J. Baliga, "Analysis of a high-voltage merged p-i-n/Schottky (MPS) rectifier," *IEEE Electron Device Letters*, vol. 8, Issue 9, Sep. 1987 pp.:407-409.

(Continued)

Primary Examiner—Hoai v Pham
(74) Attorney, Agent, or Firm—Townsend and Townsend and Crew LLP

(57) ABSTRACT

A field effect transistor (FET) includes a plurality of trenches extending into a semiconductor region. Each trench includes a gate electrode and a shield electrode with an inter-electrode dielectric therebetween. The trench extends in an active region of the FET, and the shield electrode and gate electrode extend out of the trench and into a non-active region of the FET where the shield electrode and gate electrode are electrically connected together by a first interconnect layer.

19 Claims, 5 Drawing Sheets

U.S. PATENT DOCUMENTS

| | | |
|---|---|---|
| 4,673,962 A | 6/1987 | Chatterjee et al. |
| 4,698,653 A | 10/1987 | Cardwell, Jr. |
| 4,716,126 A | 12/1987 | Cogan |
| 4,745,079 A | 5/1988 | Pfiester |
| 4,746,630 A | 5/1988 | Hui et al. |
| 4,754,310 A | 6/1988 | Coe |
| 4,767,722 A | 8/1988 | Blanchard |
| 4,774,556 A | 9/1988 | Fujii et al. |
| 4,801,986 A | 1/1989 | Chang et al. |
| 4,821,095 A | 4/1989 | Temple |
| 4,823,176 A | 4/1989 | Baliga et al. |
| 4,824,793 A | 4/1989 | Richardson et al. |
| 4,853,345 A | 8/1989 | Himelick |
| 4,868,624 A | 9/1989 | Grung et al. |
| 4,893,160 A | 1/1990 | Blanchard |
| 4,914,058 A | 4/1990 | Blanchard |
| 4,941,026 A | 7/1990 | Temple |
| 4,961,100 A | 10/1990 | Baliga et al. |
| 4,967,245 A | 10/1990 | Cogan et al. |
| 4,969,028 A | 11/1990 | Baliga |
| 4,974,059 A | 11/1990 | Kinzer |
| 4,982,260 A | 1/1991 | Chang et al. |
| 4,990,463 A | 2/1991 | Mori |
| 4,992,390 A | 2/1991 | Chang |
| 5,027,180 A | 6/1991 | Nishizawa et al. |
| 5,034,785 A | 7/1991 | Blanchard |
| 5,065,273 A | 11/1991 | Rajeevakumar |
| 5,071,782 A | 12/1991 | Mori |
| 5,072,266 A | 12/1991 | Bulucea et al. |
| 5,079,608 A | 1/1992 | Wodarczyk et al. |
| 5,105,243 A | 4/1992 | Nakagawa et al. |
| 5,111,253 A | 5/1992 | Korman et al. |
| 5,126,807 A | 6/1992 | Baba et al. |
| 5,134,448 A | 7/1992 | Johnsen et al. |
| 5,142,640 A | 8/1992 | Iwamatsu |
| 5,156,989 A | 10/1992 | Williams et al. |
| 5,164,325 A | 11/1992 | Cogan et al. |
| 5,164,802 A | 11/1992 | Jones et al. |
| 5,168,331 A | 12/1992 | Yilmaz |
| 5,168,973 A | 12/1992 | Asayama et al. |
| 5,188,973 A | 2/1993 | Omura et al. |
| 5,208,657 A | 5/1993 | Chatterjee et al. |
| 5,216,275 A | 6/1993 | Chen |
| 5,219,777 A | 6/1993 | Kang |
| 5,219,793 A | 6/1993 | Cooper et al. |
| 5,233,215 A | 8/1993 | Baliga |
| 5,242,845 A | 9/1993 | Baba et al. |
| 5,250,450 A | 10/1993 | Lee et al. |
| 5,262,336 A | 11/1993 | Pike, Jr. et al. |
| 5,268,311 A | 12/1993 | Euen et al. |
| 5,275,961 A | 1/1994 | Smayling et al. |
| 5,275,965 A | 1/1994 | Manning |
| 5,281,548 A | 1/1994 | Prall |
| 5,283,201 A | 2/1994 | Tsang et al. |
| 5,294,824 A | 3/1994 | Okada |
| 5,298,761 A | 3/1994 | Aoki et al. |
| 5,300,447 A | 4/1994 | Anderson |
| 5,300,452 A | 4/1994 | Chang et al. |
| 5,326,711 A | 7/1994 | Malhi |
| 5,346,834 A | 9/1994 | Hisamoto et al. |
| 5,350,937 A | 9/1994 | Yamazaki et al. |
| 5,365,102 A | 11/1994 | Mehrotra et al. |
| 5,366,914 A | 11/1994 | Takahashi et al. |
| 5,389,815 A | 2/1995 | Takahashi |
| 5,405,794 A | 4/1995 | Kim |
| 5,418,376 A | 5/1995 | Muraoka et al. |
| 5,424,231 A | 6/1995 | Yang |
| 5,429,977 A | 7/1995 | Lu et al. |
| 5,430,311 A | 7/1995 | Murakami et al. |
| 5,430,324 A | 7/1995 | Bencuya |
| 5,436,189 A | 7/1995 | Beasom |
| 5,438,007 A | 8/1995 | Vinal et al. |
| 5,438,215 A | 8/1995 | Tihanyi |
| 5,442,214 A | 8/1995 | Yang |
| 5,449,925 A | 9/1995 | Baliga et al. |
| 5,454,435 A | 10/1995 | Reinhardt |
| 5,473,176 A | 12/1995 | Kakumoto |
| 5,473,180 A | 12/1995 | Ludikhuize |
| 5,474,943 A | 12/1995 | Hshieh et al. |
| 5,488,010 A | 1/1996 | Wong |
| 5,519,245 A | 5/1996 | Tokura et al. |
| 5,532,197 A | 7/1996 | Kim et al. |
| 5,541,425 A | 7/1996 | Nishihara |
| 5,554,552 A | 9/1996 | Chi |
| 5,554,862 A | 9/1996 | Omura et al. |
| 5,567,634 A | 10/1996 | Hebert et al. |
| 5,567,635 A | 10/1996 | Acovic et al. |
| 5,572,048 A | 11/1996 | Sugawara |
| 5,576,245 A | 11/1996 | Cogan et al. |
| 5,578,851 A | 11/1996 | Hshieh et al. |
| 5,581,100 A | 12/1996 | Ajit |
| 5,583,065 A | 12/1996 | Miwa |
| 5,592,005 A | 1/1997 | Floyd et al. |
| 5,593,909 A | 1/1997 | Han et al. |
| 5,595,927 A | 1/1997 | Chen et al. |
| 5,597,765 A | 1/1997 | Yilmaz et al. |
| 5,605,852 A | 2/1997 | Bencuya |
| 5,614,749 A | 3/1997 | Ueno |
| 5,616,945 A | 4/1997 | Williams |
| 5,623,152 A | 4/1997 | Majumdar et al. |
| 5,629,543 A | 5/1997 | Hshieh et al. |
| 5,637,898 A | 6/1997 | Baliga |
| 5,639,676 A | 6/1997 | Hshieh et al. |
| 5,640,034 A | 6/1997 | Malhi |
| 5,648,283 A | 7/1997 | Tsang et al. |
| 5,648,670 A | 7/1997 | Blanchard |
| 5,656,843 A | 8/1997 | Goodyear et al. |
| 5,665,619 A | 9/1997 | Kwan et al. |
| 5,670,803 A | 9/1997 | Beilstein, Jr. et al. |
| 5,684,320 A | 11/1997 | Kawashima |
| 5,689,128 A | 11/1997 | Hshieh et al. |
| 5,693,569 A | 12/1997 | Ueno |
| 5,705,409 A | 1/1998 | Witek |
| 5,710,072 A | 1/1998 | Krautschneider et al. |
| 5,714,781 A | 2/1998 | Yamamoto et al. |
| 5,717,237 A | 2/1998 | Chi |
| 5,719,409 A | 2/1998 | Singh et al. |
| 5,744,372 A | 4/1998 | Bulucea |
| 5,767,004 A | 6/1998 | Balasubramanian et al. |
| 5,770,878 A | 6/1998 | Beasom |
| 5,776,813 A | 7/1998 | Huang et al. |
| 5,780,343 A | 7/1998 | Bashir |
| 5,801,417 A | 9/1998 | Tsang et al. |
| 5,814,858 A | 9/1998 | Williams |
| 5,821,583 A | 10/1998 | Hshieh et al. |
| 5,877,528 A | 3/1999 | So |
| 5,879,971 A | 3/1999 | Witek |
| 5,879,994 A | 3/1999 | Kwan et al. |
| 5,894,157 A | 4/1999 | Han et al. |
| 5,895,951 A | 4/1999 | So et al. |
| 5,895,952 A | 4/1999 | Darwish et al. |
| 5,897,343 A | 4/1999 | Mathew et al. |
| 5,897,360 A | 4/1999 | Kawaguchi |
| 5,900,663 A | 5/1999 | Johnson et al. |
| 5,906,680 A | 5/1999 | Meyerson |
| 5,907,776 A | 5/1999 | Hshieh et al. |
| 5,917,216 A | 6/1999 | Floyd et al. |
| 5,929,481 A | 7/1999 | Hshieh et al. |
| 5,943,581 A | 8/1999 | Lu et al. |
| 5,949,104 A | 9/1999 | D'Anna et al. |
| 5,949,124 A | 9/1999 | Hadizad et al. |
| 5,959,324 A | 9/1999 | Kohyama |
| 5,960,271 A | 9/1999 | Wollesen et al. |
| 5,972,741 A | 10/1999 | Kubo et al. |

| Patent No. | Date | Inventor |
|---|---|---|
| 5,973,360 A | 10/1999 | Tihanyi |
| 5,973,367 A | 10/1999 | Williams |
| 5,976,936 A | 11/1999 | Miyajima et al. |
| 5,977,591 A | 11/1999 | Fratin et al. |
| 5,981,344 A | 11/1999 | Hshieh et al. |
| 5,981,996 A | 11/1999 | Fujishima |
| 5,998,833 A | 12/1999 | Baliga |
| 6,005,271 A | 12/1999 | Hshieh |
| 6,008,097 A | 12/1999 | Yoon et al. |
| 6,011,298 A | 1/2000 | Blanchard |
| 6,015,727 A | 1/2000 | Wanlass |
| 6,020,250 A | 2/2000 | Kenny et al. |
| 6,034,415 A | 3/2000 | Johnson et al. |
| 6,037,202 A | 3/2000 | Witek |
| 6,037,628 A | 3/2000 | Huang |
| 6,037,632 A | 3/2000 | Omura et al. |
| 6,040,600 A | 3/2000 | Uenishi et al. |
| 6,048,772 A | 4/2000 | D'Anna |
| 6,049,108 A | 4/2000 | Williams et al. |
| 6,051,488 A | 4/2000 | Lee et al. |
| 6,057,558 A | 5/2000 | Yamamoto et al. |
| 6,063,678 A | 5/2000 | D'Anna |
| 6,064,088 A | 5/2000 | D'Anna |
| 6,066,878 A | 5/2000 | Neilson |
| 6,069,043 A | 5/2000 | Floyd et al. |
| 6,077,733 A | 6/2000 | Chen et al. |
| 6,081,009 A | 6/2000 | Neilson |
| 6,084,264 A | 7/2000 | Darwish |
| 6,084,268 A | 7/2000 | de Fresart et al. |
| 6,087,232 A | 7/2000 | Kim et al. |
| 6,096,608 A | 8/2000 | Williams |
| 6,097,063 A | 8/2000 | Fujihira |
| 6,103,578 A | 8/2000 | Uenishi et al. |
| 6,103,619 A | 8/2000 | Lai |
| 6,104,043 A | 8/2000 | Hermansson et al. |
| 6,104,054 A | 8/2000 | Corsi et al. |
| 6,110,799 A | 8/2000 | Huang |
| 6,114,727 A | 9/2000 | Ogura et al. |
| 6,137,152 A | 10/2000 | Wu |
| 6,150,697 A | 11/2000 | Teshigahara et al. |
| 6,156,606 A | 12/2000 | Michaelis |
| 6,156,611 A | 12/2000 | Lan et al. |
| 6,163,052 A | 12/2000 | Liu et al. |
| 6,165,870 A | 12/2000 | Shim et al. |
| 6,168,983 B1 | 1/2001 | Rumennik et al. |
| 6,168,996 B1 | 1/2001 | Numazawa et al. |
| 6,171,935 B1 | 1/2001 | Nance et al. |
| 6,174,769 B1 | 1/2001 | Lou |
| 6,174,773 B1 | 1/2001 | Fujishima |
| 6,174,785 B1 | 1/2001 | Parekh et al. |
| 6,184,545 B1 | 2/2001 | Werner et al. |
| 6,184,555 B1 | 2/2001 | Tihanyi et al. |
| 6,188,104 B1 | 2/2001 | Choi et al. |
| 6,188,105 B1 | 2/2001 | Kocon et al. |
| 6,190,978 B1 | 2/2001 | D'Anna |
| 6,191,447 B1 | 2/2001 | Baliga |
| 6,194,741 B1 | 2/2001 | Kinzer et al. |
| 6,198,127 B1 | 3/2001 | Kocon |
| 6,201,279 B1 | 3/2001 | Pfirsch |
| 6,204,097 B1 | 3/2001 | Shen et al. |
| 6,207,994 B1 | 3/2001 | Rumennik et al. |
| 6,222,229 B1 | 4/2001 | Hebert et al. |
| 6,222,233 B1 | 4/2001 | D'Anna |
| 6,225,649 B1 | 5/2001 | Minato |
| 6,228,727 B1 | 5/2001 | Lim et al. |
| 6,239,463 B1 | 5/2001 | Williams et al. |
| 6,239,464 B1 | 5/2001 | Tsuchitani et al. |
| 6,265,269 B1 | 7/2001 | Chen et al. |
| 6,271,082 B1 | 8/2001 | Hou et al. |
| 6,271,100 B1 | 8/2001 | Ballantine et al. |
| 6,271,552 B1 | 8/2001 | D'Anna |
| 6,271,562 B1 | 8/2001 | Deboy et al. |
| 6,274,904 B1 | 8/2001 | Tihanyi |
| 6,274,905 B1 | 8/2001 | Mo |
| 6,277,706 B1 | 8/2001 | Ishikawa |
| 6,281,547 B1 | 8/2001 | So et al. |
| 6,285,060 B1 | 9/2001 | Korec et al. |
| 6,291,298 B1 | 9/2001 | Williams et al. |
| 6,291,856 B1 | 9/2001 | Miyasaka et al. |
| 6,294,818 B1 | 9/2001 | Fujihira |
| 6,297,534 B1 | 10/2001 | Kawaguchi et al. |
| 6,303,969 B1 | 10/2001 | Tan |
| 6,307,246 B1 | 10/2001 | Nitta et al. |
| 6,309,920 B1 | 10/2001 | Laska et al. |
| 6,313,482 B1 | 11/2001 | Baliga |
| 6,316,806 B1 | 11/2001 | Mo |
| 6,326,656 B1 | 12/2001 | Tihanyi |
| 6,337,499 B1 | 1/2002 | Werner |
| 6,346,464 B1 | 2/2002 | Takeda et al. |
| 6,346,469 B1 | 2/2002 | Greer |
| 6,351,018 B1 | 2/2002 | Sapp |
| 6,353,252 B1 | 3/2002 | Yasuhara et al. |
| 6,359,308 B1 | 3/2002 | Hijzen et al. |
| 6,362,112 B1 | 3/2002 | Hamerski |
| 6,362,505 B1 | 3/2002 | Tihanyi |
| 6,365,462 B2 | 4/2002 | Baliga |
| 6,365,930 B1 | 4/2002 | Schillaci et al. |
| 6,368,920 B1 | 4/2002 | Beasom |
| 6,368,921 B1 | 4/2002 | Hijzen et al. |
| 6,376,314 B1 | 4/2002 | Jerred |
| 6,376,315 B1 | 4/2002 | Hshieh et al. |
| 6,376,878 B1 | 4/2002 | Kocon |
| 6,376,890 B1 | 4/2002 | Tihanyi |
| 6,384,456 B1 | 5/2002 | Tihanyi |
| 6,388,286 B1 | 5/2002 | Baliga |
| 6,388,287 B2 | 5/2002 | Deboy et al. |
| 6,400,003 B1 | 6/2002 | Huang |
| 6,426,260 B1 | 7/2002 | Hshieh |
| 6,429,481 B1 | 8/2002 | Mo et al. |
| 6,433,385 B1 | 8/2002 | Kocon et al. |
| 6,436,779 B2 | 8/2002 | Hurkx et al. |
| 6,437,399 B1 | 8/2002 | Huang |
| 6,441,454 B2 | 8/2002 | Hijzen et al. |
| 6,444,574 B1 | 9/2002 | Chu |
| 6,452,230 B1 | 9/2002 | Boden, Jr. |
| 6,459,122 B2 | 10/2002 | Uno |
| 6,461,918 B1 | 10/2002 | Calafut |
| 6,465,304 B1 | 10/2002 | Blanchard et al. |
| 6,465,843 B1 | 10/2002 | Hirler et al. |
| 6,465,869 B2 | 10/2002 | Ahlers et al. |
| 6,472,678 B1 | 10/2002 | Hshieh et al. |
| 6,472,708 B1 | 10/2002 | Hshieh et al. |
| 6,475,884 B2 | 11/2002 | Hshieh et al. |
| 6,476,443 B1 | 11/2002 | Kinzer |
| 6,479,352 B2 | 11/2002 | Blanchard |
| 6,489,652 B1 | 12/2002 | Jeon et al. |
| 6,501,146 B1 | 12/2002 | Harada |
| 6,509,240 B2 | 1/2003 | Ren et al. |
| 6,518,127 B2 | 2/2003 | Hshieh et al. |
| 6,524,900 B2 | 2/2003 | Dahlqvist et al. |
| 6,534,825 B2 | 3/2003 | Calafut |
| 6,566,804 B1 | 5/2003 | Trujillo et al. |
| 6,573,128 B1 | 6/2003 | Singh |
| 6,580,123 B2 | 6/2003 | Thapar |
| 6,608,350 B2 | 8/2003 | Kinzer et al. |
| 6,621,107 B2 | 9/2003 | Blanchard et al. |
| 6,627,949 B2 | 9/2003 | Blanchard |
| 6,635,534 B2 | 10/2003 | Madson |
| 6,657,254 B2 | 12/2003 | Hshieh et al. |
| 6,677,641 B2 | 1/2004 | Kocon |
| 6,677,643 B2 | 1/2004 | Fujihira et al. |
| 6,683,346 B2 | 1/2004 | Zeng |
| 6,689,662 B2 | 2/2004 | Blanchard |
| 6,713,813 B2 | 3/2004 | Marchant |
| 6,720,616 B2 | 4/2004 | Hirler et al. |
| 6,724,042 B2 | 4/2004 | Onishi et al. |

| | | | |
|---|---|---|---|
| 6,734,066 B2 | 5/2004 | Lin et al. | |
| 6,750,508 B2 | 6/2004 | Omura et al. | |
| 6,756,636 B2 | 6/2004 | Onishi et al. | |
| 6,762,127 B2 | 7/2004 | Boiteux et al. | |
| 6,806,533 B2 | 10/2004 | Henninger et al. | |
| 6,821,824 B2 | 11/2004 | Minato et al. | |
| 6,833,584 B2 | 12/2004 | Henninger et al. | |
| 6,833,585 B2 | 12/2004 | Kim et al. | |
| 6,861,723 B2 | 3/2005 | Willmeroth | |
| 6,878,944 B1 | 4/2005 | Gerstenmayer et al. | |
| 6,892,098 B2 | 5/2005 | Ayal et al. | |
| 6,897,133 B2 | 5/2005 | Collard | |
| 6,921,939 B2 | 7/2005 | Zeng | |
| 7,005,351 B2 | 2/2006 | Henninger et al. | |
| 7,033,876 B2 | 4/2006 | Darwish et al. | |
| 7,091,573 B2 * | 8/2006 | Hirler et al. | 257/500 |
| 2002/1769980 | 12/2002 | Snyder et al. | |
| 2003/0235936 A1 | 12/2003 | Snyder et al. | |
| 2004/0232407 A1 | 11/2004 | Calafut | |
| 2005/0017293 A1 | 1/2005 | Zundel et al. | |

FOREIGN PATENT DOCUMENTS

| | | |
|---|---|---|
| DE | 4300806 C1 | 12/1993 |
| DE | 19736981 A1 | 8/1998 |
| DE | 102414160 | 10/2003 |
| DE | 102004057235 | 6/2006 |
| EP | 133642 | 3/1985 |
| EP | 288739 | 11/1988 |
| EP | 292782 | 11/1988 |
| EP | 0 345 380 A2 | 12/1989 |
| EP | 975024 A2 | 1/2000 |
| EP | 1026749 A1 | 8/2000 |
| EP | 1054451 A2 | 11/2000 |
| EP | 1 170 803 A2 | 1/2002 |
| EP | 747967 B1 | 2/2002 |
| EP | 1205980 A1 | 5/2002 |
| JP | 56-058267 A | 5/1981 |
| JP | 62-069562 | 1/1987 |
| JP | 63-186475 | 8/1988 |
| JP | 63-288047 | 11/1988 |
| JP | 64-022051 | 1/1989 |
| JP | 01-192174 A | 8/1989 |
| JP | 05-226638 A | 9/1993 |
| JP | 2000-040822 | 2/2000 |
| JP | 2000-040872 | 2/2000 |
| JP | 2000-156978 A | 6/2000 |
| JP | 2000-277726 A | 10/2000 |
| JP | 2000-277728 A | 10/2000 |
| JP | 2001-015752 | 1/2001 |
| JP | 2003-015448 | 1/2001 |
| JP | 2001-102577 A | 4/2001 |
| JP | 2001-111041 A | 4/2001 |
| JP | 2001-135819 A | 5/2001 |
| JP | 2001-144292 A | 5/2001 |
| JP | 2001-244461 A | 9/2001 |
| JP | 2001-313391 A | 12/2001 |
| JP | 2002-083976 A | 3/2002 |
| WO | WO 00/33386 A2 | 6/2000 |
| WO | WO 00/68997 A1 | 11/2000 |
| WO | WO 00/68998 A1 | 11/2000 |
| WO | WO 00/75965 A2 | 12/2000 |
| WO | WO 01/06550 A1 | 1/2001 |
| WO | WO 01/06557 A1 | 1/2001 |
| WO | WO 01/45155 A1 | 6/2001 |
| WO | WO 59847 A2 | 8/2001 |
| WO | WO 01/71815 | 9/2001 |
| WO | WO 01/95385 A1 | 12/2001 |
| WO | WO 01/95398 A1 | 12/2001 |
| WO | WO 02/01644 A2 | 1/2002 |
| WO | 02 13257 A2 | 2/2002 |
| WO | WO 02/047171 A1 | 6/2002 |

OTHER PUBLICATIONS

W.V. Muench and I. Pfaffeneder: "Breakdown field in vapor-grown silicon carbide p-n junctions," *Journal of Applied Physics*, vol. 48, No. 11, Nov. 1977.

V.E. Chelnokov, A.M. Strel'chuk, P.A. Ivanov; G. Lentz, C. Parniere: "Silicon carbide p-n structures as power rectifiers," *Proceedings of the 6th International Symposium on Power Semiconductor Devices and ICs*, 1994. ISPSD '94, pp.: 253-256.

K.V. Vasilevskki, K. Zekentes, A.V. Zorenko, and L.P. Romonov: "Experimental Determination of Electron Drift Velocity in 4$H$-SiC p+-n-n+ Avalanche Diodes," *IEEE Electron Device Letters*, vol. 21, No. 10, Oct. 2000 pp.: 485-487.

L. Yuan, J.A. Cooper, Jr., M.R. Melloch, and K.J. Webb: "Experimental Demonstration of a Silicon Carbide IMPATT Oscillator," *IEEE Electron Device Letters*, vol. 22, No. 6, Jun. 2001, pp.: 266-268.

D.T. Morisette and J.A. Cooper, Jr: "Theoretical Comparison of SiC PiN and Schottky Diodes Based on Power Dissipation Considerations," *IEEE Transactions on Electron Devices*, vol. 49, No. 9, Sep. 2002, pp.: 1657-1664.

I. Sankin, J.B. Casady, "Power SiC MOSFETSs," book chapter: *Advances in Silicon Carbide Processing and Applications*, S.E. Saddow and A. Agrawal, Editors, 2004.

H. Saitoh, T. Kimoto, and H. Matsunami: "Origin of Leakage current in SiC Schottky Barrier Diodes at High Temperature," Material Science Forum vols. 457-460 (2004) pp. 997-1000.

A.O. Konstantinov, Q. Wahab, N. Nordell, U. Lindefelt: "Ionization rates and critical fields in 4H silicon carbide," *Appl. Phys. Lett.*, vol. 71, No. 1, Jul. 7, 1997, pp.: 90-92.

BAI et al., "Novel automated optimization of power MOSFET for 12V input, high-frequency DC-DC converter," *International Symposium on Power Semiconductors and ICs, Technical Digest*, (2003), pp. 366-369.

Baliga "New Concepts in Power Rectifiers," Physics of Semiconductor Devices, Proceedings of the Third Int'l Workshop, Madras (India), Committee on Science and Technology in Developing Countries (1985), pp. 471-481.

Baliga "Options for CVD of Dielectrics Include Low-k Materials," Technical Literature from Semiconductor International, Jun. 1998, 4 pages total.

Baliga et al., "Inproving the reverse recovery of power MOSFET integral diodes by electron irradiation," (Dec. 1983) *Solid State Electronics*, vol. 26, No. 12, pp. 1133-1141.

Brown et al. Novel Trench Gate Structure Developments Set the Benchmark for Next Generation Power MOSFET Switching Performance. Power Electronics-May 2003 Proceedings (PCIM), Nurenburg, vol. 47, pp. 275-278.

Bulucea "Trench DMOS Transistor Technology For High Current (100 A Range) Switching" Solid-State Electronics vol. 34 No. pp. 493-507 (1991).

Chang et al. "Numerical and experimental Analysis of 500-V Power DMOSFET with an Atomic-Lattice Layout," IEEE Transactions on Electron Devices 36:2623 (1989).

Chang et al. "Self-Aligned UMOSFET's with a Specific On-Resistance of 1m$\Omega$ cm$^2$," IEEE Transactions on Electron Devices 34:2329-2334 (1987).

Cheng et al., "Fast reverse recovery body diode in high-voltage VDMOSFET using cell-distributed schottky contacts," (May 2003) *IEEE Transactions on Electron Devices*, vol. 50, No. 5, pp. 1422-1425.

"CoolMOS™ the second generation," Infineon Technologies product information, (2000), 2 pages total.

Curtis, et al. "APCVD TEOS: 03 Advanced Trench Isolation Applications," Semiconductor Fabtech 9th Edition (1999) 8 pages total.

Darwish et al. A New Power W-Gated Trench MOSFET (WMOSFET) with High Switching Performance. ISPSD Proceedings-Apr. 2003, Cambridge, 4 pages total.

Djekic, O. et al., "High frequency synchonous buck converter for low voltage applications," (1998) *Proc. IEEE Power Electronics Specialist Conf. (PESC)*, pp. 1248-1254.

Fujihira "Theory of Semiconductor Superjunction Devices"Jpn. J. Appl. Phys. vol. 36 pp. 6254-6262 (1997).

Gan et al. "Poly Flanked VDMOS (PFVDMOS): A Superior Technology for Superjunction Devices," IEEE Power ElectronicsSpecialists Conference, Jun. 17-22, 2001, Vancouver, Canada (2001), 4 pages total.

Glenn et al. "A Novel Vertical Deep Trench RESURF DMOS (VTR-DMOS)" IEEE ISPD May 22-25, 2000, Toulouse France, pp. 197-200.

"IR develops CoolMOS™-equivalent technology, positions it at the top of a 3-tiered line of new products for SMPS," International Rectifiers company information available at http://www.irf.com (1993) 3 pages total.

Kao et al. "Two Dimensional thermal Oxidation of Silicon-I. Experiments,", *IEEE Transactions on Electron Devices*, vol. ED-34, No. 5, May 1987, pp. 1008-1017.

Kao et al. "Two Dimentional Thermal Oxidation of Silicon-II. Modeling Stress Effects in Wet Oxides," *IEEE Transactions on Electron Devices*, vol. ED-35, No. 1, Jan. 1988. pp. 25-37.

Kassakian, J.G. et al., "High-frequency high-density converters for distributed power supply systems," (Apr. 1988) *Proceedings for the IEEE*, vol. 76, No. 4, pp. 362-376.

Korman, C.S. et al., "High performance power DMOSFET with integrated schottky diode," (1989) *Proc. IEEE Power Electronics Specialist Conf. (PESC)*, pp. 176-179.

Lorenz et al., "COOL MOS-An important milestone towards a new power MOSFET generation" Power Conversion pp. 151-160 (1988).

Maksimovic, A.M. et al., "Modeling and simulation of power electronic converters," (Jun. 2001) *Proceedings of the IEEE*, vol. 89, No. 6, pp. 898-912.

Mehrotra, M. et al., "Very low forward drop JBS rectifiers fabricated using submicron technology," (Nov. 1993) *IEEE Transactions on Electron Devices*, vol. 40, No. 11, pp. 2131-2132.

Miller, "Power Managment & Supply-Market, Applications Technologies-an Overview," Infineon Technologies, downloaded from the internet <<http://www.ewh.ieee.org/r8/germany/ias-pels/m_regensburg/overview_miller.pdf>>, May 5, 2003, 53 pages total.

Moghadam "Delivering Value Around New Industry Paradigms," Technical Literature from Applied Materials, pages 1-11, vol. 1, Issue 2, Nov. 1999.

Park et al., "Lateral Trench Gate Super-Junction SOI-LDMOSFETs with Low On-Resistance," Institute for Microelectronics, University of Technology Vienna, Austria (2002), pp. 283-285.

Sakai et al., "Experimental investigation of dependence of electrical characteristics of device parameters in trench MOS barrier, schottky diodes," (1998) *International Symposium on Power Semiconductors and ICs, Technical Digest*, pp. 293-296.

Shenai et al., "Current transport mechanisms in anatomically abrupt metal-semiconductor interfaces," (Apr. 1988) *IEEE Transactions on Electron Devices*, vol. 35, No. 4, pp. 468-482.

Shenai et al., "Monolithically integrated power MOSFET and schottky diode with improved reverse recovery characteristics," (Apr. 1990) *IEEE Transactions on Electron Devices*, vol. 37, No. 4, pp. 1167-1169.

Shenoy et al."Analysis of the Effect of Charge Imbalance on the Static and Dynamic Characteristic of the Super Junction MOSFET," IEEE International Symposium on Power Semiconductor Devices 1999, pp. 99-102 (1999).

Singer "Empty Spaces in Silicon (ESS): An Alternative to SOI," Semiconductor International page 42, Dec. 1999.

Tabisz et al., "A MOSFET resonant synchronous rectifier for high-frequency dc/dc converters," (1990) *IEEE Power Electronics Specialist Conf.* (PESC), pp. 769-779.

Tu et al. "On the reverse blocking characteristics of schottky power diodes," (Dec. 1992) *IEEE Transactions on Electron Devices*. vol. 39, No. 12, pp. 2813-2814 2 pages total.

Ueda et al. "An Ultra-Low On-Resistance Power MOSFET Fabricated by Using a Fully Self-Aligned Process," IEEE Transactions on Electron Devices 34:926-930 (1987).

Wilamowski "Schottky Diodes with High Breakdown Voltages," Solid-State Electronics 36:491-493 (1983).

Wolf et al., "Silicon Processing for The VLSI Era" vol. 1-Process Technology, Secomd Edition, (1990), pp. 658.

Wolf, "Silicon Processing for The VSLI Era" vol. 2 Process Integration Lattice Press (1990), 3 pages total.

Yamashita et al., Conduction Power loss in MOSFET synchronous rectifier with parallel-connected schottky barrier diode, (jul. 1998) *IEEE Transaction on Power electronics*, vol. 13, No. 4, pp. 667-673.

Xu, S. et al., "Dummy Gated Radio Frequency VDMOSFET with High Breakdown Voltage and Low Feedback Capacitance," Proc. of 12th International Symposium on Power Semiconductor Devices & ICS (ISPSD'2000), Toulouse, France, May 22-25, 2000, pp. 385-388, XP002200791, IEEE, Piscataway, NJ, USA, ISBN 0-7803-6269-1.

* cited by examiner

SHIELDED GATE TRENCH FET WITH THE SHIELD AND GATE ELECTRODES BEING CONNECTED TOGETHER

BACKGROUND OF THE INVENTION

The present invention relates in general to semiconductor power field effect transistors (FETs) and in particular to shielded gate trench FETs with their shield and gate electrodes connected together.

Shielded gate trench FETs are advantageous over conventional FETs in that the shield electrode reduces the gate-drain capacitance (Cgd) and improves the breakdown voltage of the transistor. FIG. 1 is a simplified cross sectional view of a conventional shielded gate trench MOSFET. An n-type epitaxial layer 102 extends over n+ substrate 100. N+ source regions 108 and p+ heavy body regions 106 are formed in a p-type body region 104 which is in turn formed in epitaxial layer 102. Trench 110 extends through body region 104 and terminates in the drift region. Trench 110 includes a shield electrode 114 below a gate electrode 122. Gate electrode 122 is insulated from its adjacent silicon regions by gate dielectric 120, and Shield electrode 114 is insulated from its adjacent silicon regions by a shield dielectric 112 which is thicker than gate dielectric 120.

The gate and shield electrodes are insulated from one another by a dielectric layer 116 also referred to as inter-electrode dielectric or IED. IED layer 116 must be of sufficient quality and thickness to support the potential difference that may exist between shield electrode 114 and gate electrode 122. In addition, interface trap charges and dielectric trap charges in IED layer 116 or at the interface between the shield electrode 114 and IED layer 116 are associated primarily with the methods for forming the IED layer.

The IED is typically formed by various processing methods. However, insuring a high-quality IED that is sufficiently robust and reliable enough to provide the required electrical characteristics results in complicated processes for forming the shielded gate trench FET. Accordingly, there is a need for structure and method of forming shielded gate trench FET that eliminate the need for a high-quality IED while maintaining or improving such electrical characteristics as on-resistance.

BRIEF SUMMARY OF THE INVENTION

According to an embodiment of the invention a field effect transistor includes a plurality of trenches extending into a semiconductor region. Each trench includes a gate electrode and a shield electrode with an inter-electrode dielectric therebetween, wherein the shield electrode and the gate electrode are electrically connected together.

In one embodiment, the shield electrode is in a lower portion of each trench, and is insulated from the semiconductor region by a shield dielectric. An inter-electrode dielectric extends over each shield electrode. The gate electrode is in an upper portion of each trench over the inter-electrode dielectric, and is insulated from the semiconductor region by a gate dielectric.

In another embodiment, the semiconductor region includes a drift region of a first conductivity type, a body region of a second conductivity type extending over the drift region, and source regions of the first conductivity type in the body region adjacent to the trench.

In another embodiment, the semiconductor region further includes a substrate of the first conductivity type, with the drift region extending over the substrate, wherein the trenches extend through the body region and terminate within the drift region.

In another embodiment, the trenches extend through the body region and the drift region and terminate within the substrate.

In another embodiment, the field effect transistor further includes an active region wherein the trenches are formed and a non-active region. The shield electrode and the gate electrode extend out of each trench and into the non-active region where the shield electrode and gate electrode are electrically connected together by a gate interconnect layer.

In another embodiment, the electrical connection between the shield and gate electrodes is made through periodic contact openings formed in a gate runner region of the non-active region.

In yet another embodiment, the shield electrode is electrically connected to the gate electrode by an additional connection through the inter-dielectric layer in each trench.

In another embodiment, the non-active region includes a termination region extending along a perimeter of a die housing the FET, the shield electrode and gate electrode extending out of each trench and into the termination region where the shield electrode and gate electrode are electrically connected together by a gate interconnect layer.

In accordance with another embodiment of the invention, a field effect transistor is formed as follows. A plurality of trenches is formed extending into a semiconductor region. A shield electrode is formed in a bottom portion of each trench. A gate electrode is formed in an upper portion of each trench over the shield electrode. A gate interconnect layer electrically connecting the shield electrode and the gate electrode is formed.

In one embodiment, a shield dielectric layer lining lower sidewalls and a bottom surface of each is formed prior to forming the shield electrode. A dielectric layer lining upper trench sidewalls and a surface of the shield electrode is formed before forming the gate electrode.

In another embodiment, the shield electrode and the gate electrode are formed so that both the shield electrode and gate electrode extend out of the trench and over a mesa region. A plurality of contact openings is formed in the portion of the gate electrode extending over the mesa region so as to expose surface areas of the shield electrode through the contact openings. The interconnect layer is formed to fill the contact openings thereby electrically connecting the shield and gate electrode to one another.

In another embodiment, the mesa region is in a non-active region of a die housing the FET.

In another embodiment, the dielectric layer is formed by oxidation of silicon.

In another embodiment, one or more openings are formed in a portion of the dielectric layer extending over the shield electrode prior to forming the gate electrode so that upon forming the gate electrode in the trench, the gate electrode electrically contacts the shield electrode through the one or more openings.

DETAILED DESCRIPTION OF THE INVENTION

FIGS. 2A-2H are simplified cross sectional views at various steps of a process for forming a shielded gate trench FET according to an embodiment of the invention. In FIGS. 2A-2H, the left cross section views depict the sequence of steps leading to formation of the shield gate trench FET structure in the active region, and the right cross section views depict corresponding views of a transition region from active region to non-active region (from right to left). In this disclosure, "active region" represents areas of a die housing the active cells, and "non-active region" represents areas of the die which do not include any active cells. The non-active region includes the termination region extending along the perimeter of the die and the gate runners extending along the perimeter or middle of the die or along both the perimeter and middle of the die.

Figure 1:
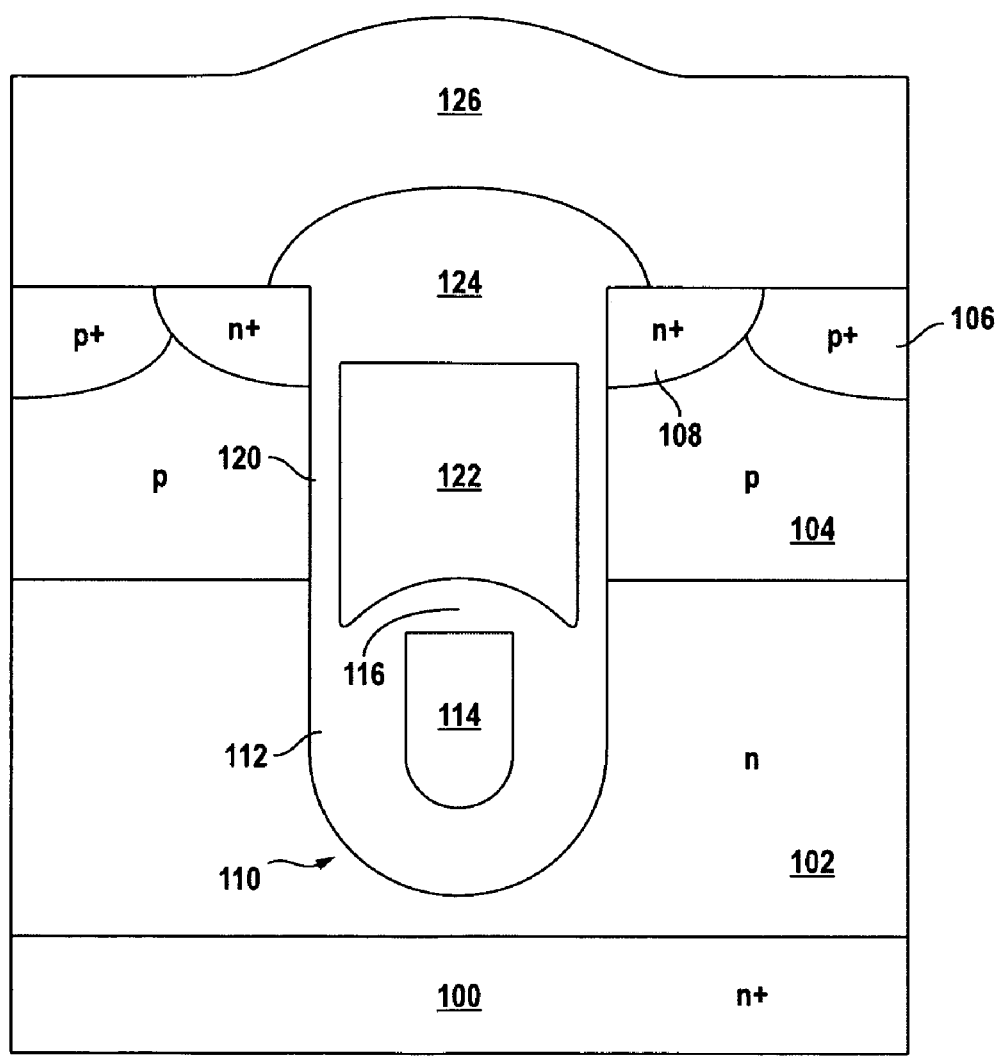
FIG. 1 is a cross sectional view of a conventional shielded gate trench MOSFET.
Figure 2A:
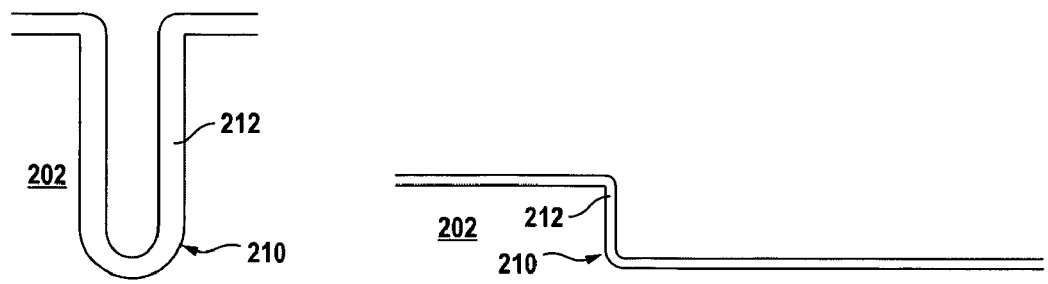
FIGS. 2A-2H are simplified cross sectional views at various steps of a process for forming a shielded gate trench FET according to an embodiment of the invention.

In FIG. 2A, using conventional techniques, trench 210 is formed in a semiconductor region 202, and then a shield dielectric 212 (e.g., comprising oxide) is formed lining the trench sidewalls and bottom surface and extending over mesa regions adjacent the trench. The right cross section view in each of FIGS. 2A-2H is through the center of the trench in the left cross section view, along a dimension perpendicular to the left cross section view. Thus, the right cross section view shows the trench of the left cross section view terminating at the edge of the active region. Also, the cross section views are not to scale, and in particular, the physical dimensions (e.g., thickness) of the same layers or regions in the right and the left cross section views may not appear the same. For example, in FIG. 2A, shield dielectric 212 appears thinner in the right cross section view than the left.

As shown in the right cross section view of FIG. 2A, shield dielectric 212 extends along the bottom surface of trench 210, and at the edge of the active region, extends up and out of trench 210 and over silicon region 202. In one embodiment semiconductor region 202 includes an n-type epitaxial layer (not shown) formed over a highly doped n-type substrate (not shown), and trench 202 extends into and terminates within epitaxial layer. In another variation, trench 202 extends through the epitaxial layer and terminates within the substrate.

Figure 2B:
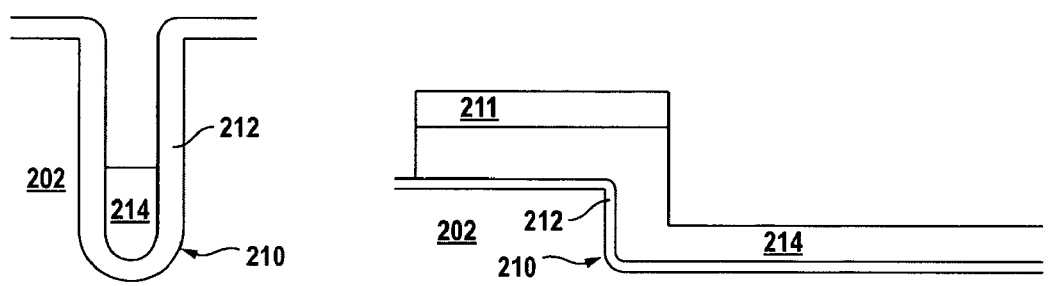

In FIG. 2B, shield electrode 214 is formed along a bottom portion of trench 210 and is made electrically accessible in the non-active region of the die, as follows. Using known techniques, a conductive material (e.g., comprising doped or undoped polysilicon) is first formed filling the trench and extending over the mesa regions, and subsequently recessed deep into trench 210 to form shield electrode 214.

During recessing of the conductive material, a mask 211 is used to protect portions of the conductive material extending in the non-active region of the die. As a result, shield electrode 214 is thicker inside trench 210 than over the mesa surfaces in the non-active region of the die, as depicted in the right cross section view in FIG. 2B. Further mask 211 is applied such that, at the edge of the active region, the shield electrode extends out of trench 210 and over the mesa surface of the non-active region. Shield electrode 214 inside trench 210 is thus made available for electrical connectivity in the non-active region of the die.

Figure 2C:
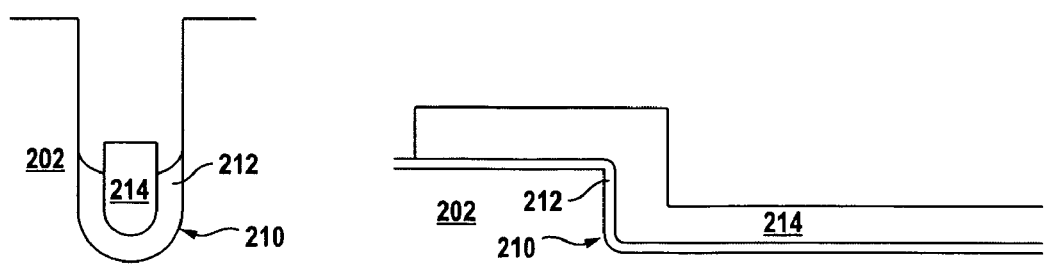

In FIG. 2C, using known methods, shield dielectric 212 is completely removed from along trench sidewalls and over mesa surfaces in the active region, as depicted by the right cross section view. The shield dielectric is thus recessed below the top surface of shield electrode 214. In one embodiment, shield electrode 214 is recessed so that its top surface becomes co-planar with that of the shield dielectric layer 212. This provides a planar surface for the subsequent formation of gate/inter-electrode dielectric layer.

Figure 2D:
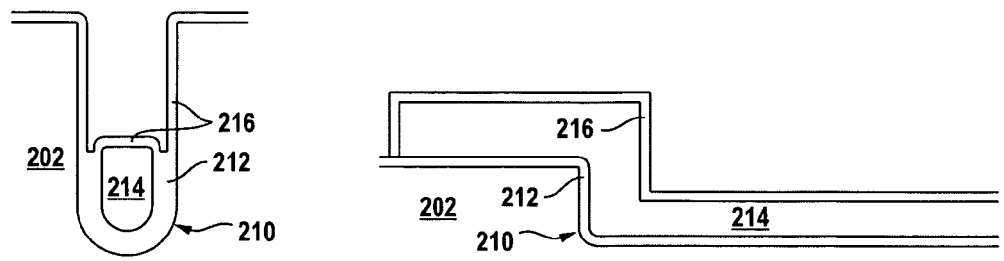

In FIG. 2D, a gate dielectric layer 216 extending along upper trench sidewalls is formed using conventional techniques. In one embodiment, gate dielectric 216 is formed using conventional oxidation of silicon. This process also results in oxidation of shield electrode 214 thus forming an inter-electrode dielectric (IED) layer over gate electrode 214. As shown in the right cross section view, dielectric layer 216 extends along all exposed surfaces of the shield electrode 214 in the active and non-active regions. As further discussed below, the additional process steps typically required for forming a high-quality IED are eliminated.

Figure 2E:
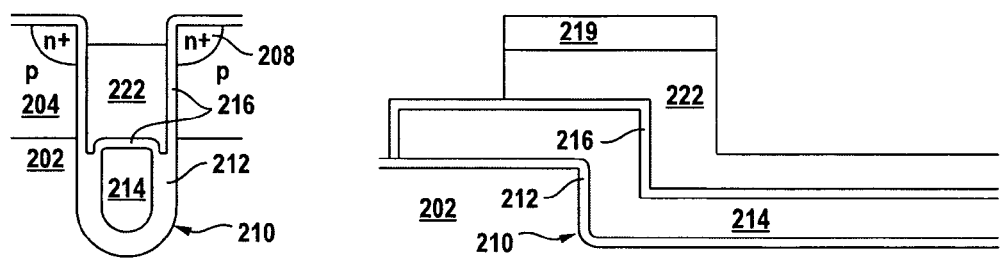

In FIG. 2E, recessed gate electrode 222 is formed in trench 210 and is made electrically accessible in the non-active region as follows. Using conventional techniques, a second conductive layer (e.g., comprising doped polysilicon) is formed filling trench 210 and extending over the mesa surfaces in the active and non-active regions of the die. The second conductive layer is then recessed into trench 210 to form gate electrode 222.

During recessing of the second conductive layer, a mask 219 is used to protect portions of the second conductive material extending in the non-active region of the die. As a result, gate electrode 222 is thicker inside trench 210 than over the mesa surfaces in the non-active region of the die, as depicted in the right cross section view in FIG. 2B. Further mask 219 is applied such that, at the edge of the active region, the recessed gate electrode 222 extends out of trench 210 and over the mesa surface of the non-active region. Gate electrode 222 inside trench 210 is thus made available for electrical connectivity in the non-active region of the die. Note that mask 219 does not extend over the entire shield electrode 214 in the non-active region. As will be seen, this facilitates contacting both the gate electrode and shield electrode through the same contact opening.

In FIG. 2E, p-type body regions 204 are formed in semiconductor region 202 using conventional body implant and drive in techniques. Highly doped n-type source regions 208 are then formed in body regions 216 adjacent trench 210 using conventional source implant techniques.

Figure 2F:
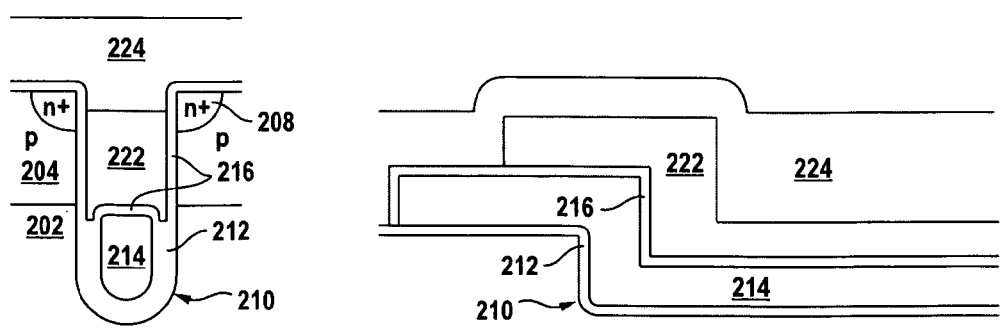
Figure 2G:
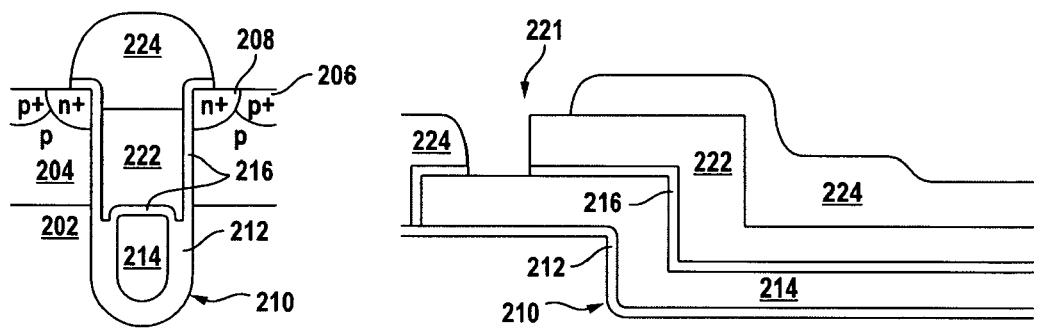

In FIG. 2F, a dielectric layer 224, such as BPSG, is formed over the structure using known techniques. In FIG. 2G, dielectric layer 224 is patterned and etched to form source/body contact openings in the active region, followed by a dielectric flow. As shown in the left cross section, a dielectric dome 225 extending fully over gate electrode 222 and partially over source regions 208 is formed. P-type heavy body regions 206 are then formed in exposed semiconductor regions 202 using conventional implant techniques. The same masking/etching process for forming contact openings in the active region is used to form a contact opening 221 in dielectric layer 224 in the non-active region in order to expose a surface region and sidewall of gate electrode 222 and a surface region of shield electrode 214, as shown in the right cross section view.

Figure 2H:
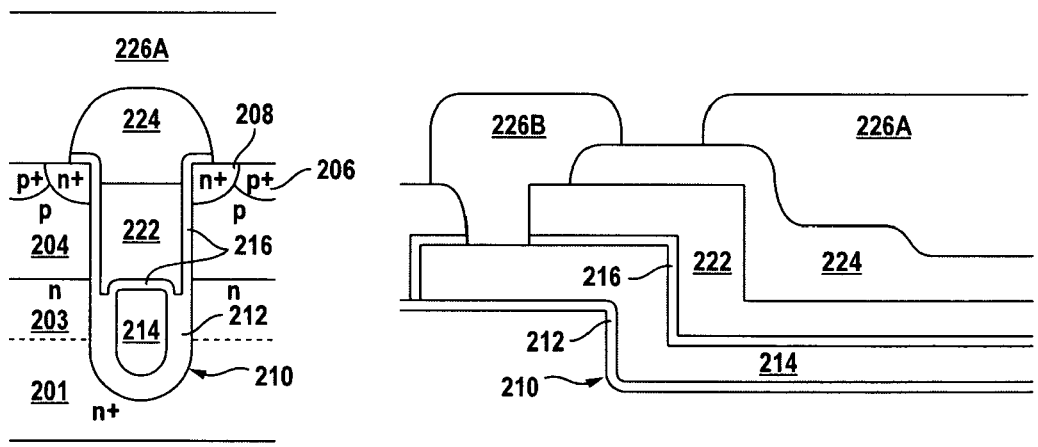

In FIG. 2H, an interconnect layer (e.g., comprising metal) is formed over the structure and then patterned to form source/body interconnect 226A and gate interconnect 226B. As shown in the left cross section view, source/body interconnect 226A contacts source regions 208 and heavy body regions 106 but is insulated from gate electrode 222 by dielectric dome 224. As shown in the right cross section view, gate metal 226B contacts both shield electrode 214 and gate electrode 222 through contact opening 221, thus shorting the two electrodes to one another.

Thus, contrary to conventional shielded gate FETs wherein the shield electrode either floats (i.e., is electrically unbiased) or is biased to the source potential (e.g., ground potential), in the FET embodiment shown in FIG. 2H, the shield electrode is connected and biased to the same potential as the gate electrode. In conventional FETs where the shield electrode is floating or connected to ground potential, a high-quality IED is typically required to support the potential difference between the shield and gate electrodes. However, electrically connecting together the shield and gate electrodes eliminates the need for a high-quality IED. The shield electrode, although biased to the gate potential, still serves as a charge balance structure enabling the reduction of the on resistance for the same breakdown voltage. Thus, a low on-resistance for the same breakdown voltage is obtained while the process steps associated with forming a high quality IED are eliminated. Theoretically, such a structure would not even need an IED, but the IED is formed naturally during the formation of gate dielectric. Thus, a high performance transistor is formed using a simple manufacturing process.

Figure 3:
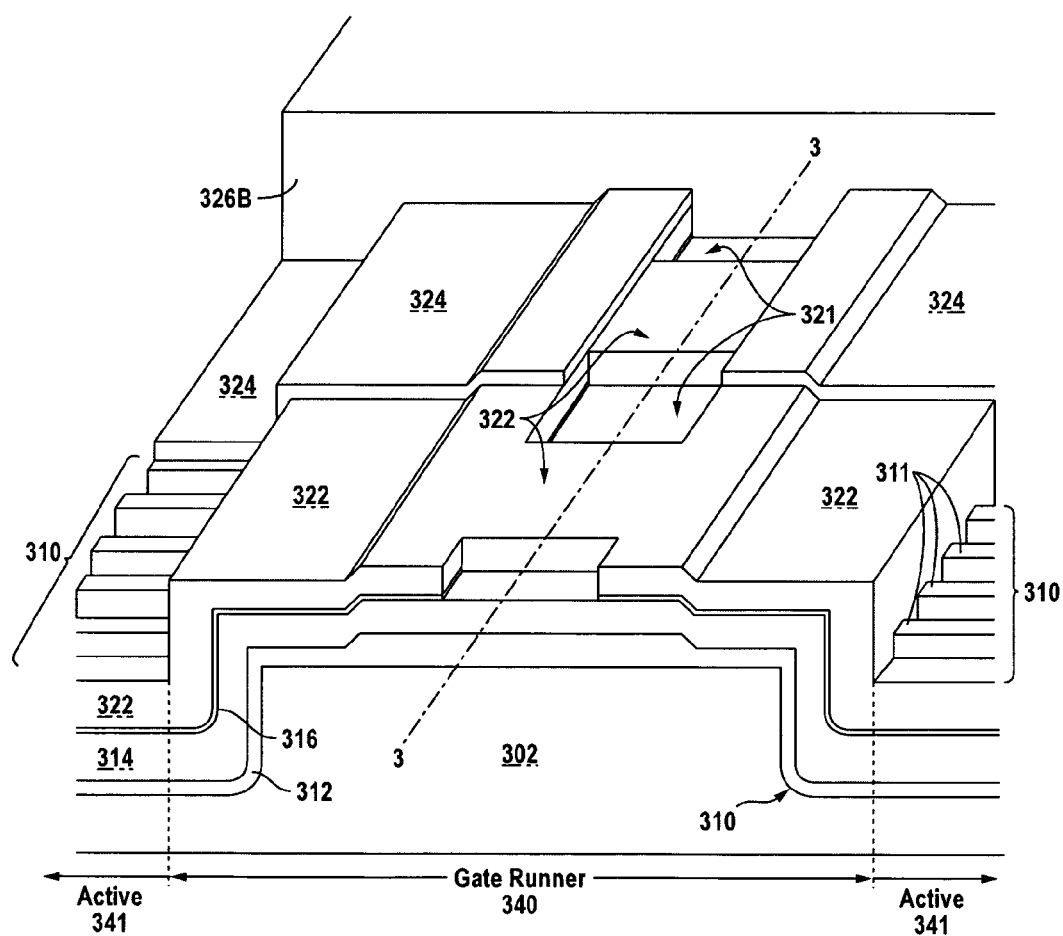
FIG. 3 is an isometric view of a portion of a gate runner in a shielded gate trench FET, according to an embodiment of the invention.

The electrical contact between the gate and shield electrodes may be formed in any non-active region, such as in the termination or edge regions of the die, or in the middle of the die where the gate runners extend as shown in FIG. 3. FIG. 3 is an isometric view of a portion of a gate runner in a shielded gate trench FET, according to an embodiment of the invention. The upper layers (e.g., gate interconnect layer 326B and dielectric layer 324) are peeled back in order to reveal the underlying structures. As shown, trenches 310 extending in parallel in the active region 341 terminate on either side of the gate runner region 340.

The gate runner region 340 is structurally symmetrical about line 3-3, with each half being structurally similar to that shown in FIG. 2H. Shield dielectric 312 extends out of the rows of trenches 310 and onto the mesa surface in gate runner region 340. Likewise, each of shield electrode 314, inter-electrode dielectric 316 and gate electrode 322 extend out of the rows of trenches 310 and onto the mesa surface in gate runner region 340. Regions 311 represent the mesas between adjacent trenches in the active region 341.

Contact openings 321 expose surface areas of shield electrode 314 to which gate interconnect layer 326B (e.g., comprising metal) makes electrical contact. Additionally, gate interconnect layer 326B makes electrical contact with surface areas 332 of gate electrodes 322 exposed through dielectric layer 324. It is desirable to minimize the gate resistance in order to minimize the delay in biasing the individual gate electrodes inside the trenches. For the same reasons, it is desirable to minimize the delay in biasing the individual shield electrodes inside the trenches. Accordingly, the frequency and shape of contact openings 321 in gate runner region 340 can be optimized to minimize the resistance and thus the delay from the gate pad to each of the gate and shield electrodes. The delay in biasing the shield and gate electrodes can be further reduced by forming the gate electrode to shield electrode contacts in both the gate runner regions and in the termination or edge regions of the die.

The shield and gate electrodes may be electrically connected in other ways according to other embodiments of the invention. For example, the IED in each trench may be etched in certain places before forming the gate electrode over the IED. In this embodiment, contact openings as shown in FIGS. 2H and 3 would not be necessary, and a gate interconnect contact to the gate electrode in each trench would also be coupled to the corresponding shield electrode through shorts in the IED. According to the other embodiments, gate and shield electrode contacts may be formed through openings in the IED and through contact openings formed in the non-active regions such as the termination and gate runner regions. The elimination of the need to form a high-quality IED results in a simplified and more controllable process for forming shielded gate trench MOSFETs with improved drain-to-source on-resistance $R_{DSon}$.

The principles of the invention may be applied to any shielded gate FET structures such as those shown in FIGS. 3A, 3B, 4A, 4C, 6-8, 9A-9C, 11, 12, 15, 16, 24 and 26A-26C of patent application Ser. No. 11/026,276, titled "Power Semiconductor Devices and Methods of Manufacture," which disclosure is incorporated herein by reference in its entirety for all purposes.

While the above provides a complete description of the preferred embodiments of the invention, many alternatives, modifications, and equivalents are possible. Those skilled in the art will appreciate that the same techniques can apply to other types of super junction structures as well as more broadly to other kinds of devices including lateral devices. For example, while embodiments of the invention are described in the context of n-channel MOSFETs, the principles of the invention may be applied to p-channel MOSFETs by merely reversing the conductivity type of the various regions. Therefore, the above description should not be taken as limiting the scope of the invention, which is defined by the appended claims.

What is claimed is:

1. A field effect transistor (FET) comprising:
   a trench extending into a semiconductor region;
   a shield electrode in a lower portion of the trench, the shield electrode being insulated from the semiconductor region by a shield dielectric;
   an inter-electrode dielectric (IED) over the shield electrode; and
   a gate electrode in an upper portion of the trench over the IED, the gate electrode being insulated from the semiconductor region by a gate dielectric, wherein the shield electrode is electrically connected to the gate electrode,
   wherein the trench extends in an active region of the FET, the shield electrode and gate electrode extending out of the trench and into a non-active region of the FET where the shield electrode and gate electrode are electrically connected together by a first interconnect layer.

2. The FET of claim 1 wherein the semiconductor region comprises:
   a drift region of a first conductivity type;
   a body region of a second conductivity type extending over the drift region; and
   source regions of the first conductivity type in the body region adjacent to the trench.

3. The FET of claim 2 wherein the gate electrode is recessed in the trench to below a top surface of the semiconductor region, the FET further comprising:
   a second interconnect layer contacting the source and body regions; and
   a dielectric material over the gate electrode for insulating the gate electrode and the interconnect layer from one another.

4. The FET of claim 2 further comprising a substrate of the first conductivity type, the drift region extending over the substrate, wherein the trench extends through the body region and terminates within the drift region.

5. The FET of claim 2 further comprising a substrate of the first conductivity type, the drift region extending over the substrate, wherein the trench extends through the body region and the drift region and terminates within the substrate.

6. The FET of claim 2 wherein the electrical connection between the shield and gate electrodes is made through periodic contact openings formed in a gate runner region of the non-active region.

7. The FET of claim 2 wherein the shield electrode is electrically connected to the gate electrode by an additional connection through the IED in the trench.

8. The FET of claim 1 wherein the gate electrode is electrically connected to the shield electrode through at least one opening in the IED inside the trench.

9. The FET of claim 1 wherein the non-active region includes a termination region extending along a perimeter of a die housing the FET, the electrical connection between the shield electrode and gate electrode being made in the termination region.

10. The FET of claim 9 wherein the electrical connection between the shield and gate electrodes is made through one or more contact openings in the termination region.

11. A field effect transistor (FET) in a semiconductor die comprising:
   an active region housing active cells;
   a non-active region with no active cells therein;
   a drift region of a first conductivity type;
   a body region of a second conductivity type over the drift region; and
   a plurality of trenches extending through the body region and into the drift region, each trench including a shield electrode and a gate electrode, the shield electrode being disposed below the gate electrode;
   wherein the shield electrode and the gate electrode extend out of each trench and into the non-active region where the shield electrode and gate electrode are electrically connected together by a gate interconnect layer.

12. The FET of claim 11 further comprising:
   source regions of the first conductivity type in the body region adjacent to each trench; and
   heavy body regions of the second conductivity type in the body region adjacent the source regions.

13. The FET of claim 12 wherein the gate electrode is recessed in the trench to below a top surface of the source regions, the FET further comprising:
   an interconnect layer contacting the source regions and heavy body regions; and
   a dielectric material over the gate electrode for insulating the gate electrode and the interconnect layer from one another.

14. The FET of claim 11 further comprising a substrate of the first conductivity type, the drift region extending over the substrate, wherein each trench terminates within the drift region.

15. The FET of claim 11 further comprising a substrate of the first conductivity type, the drift region extending over the substrate, wherein each trench extends through the drift region and terminates within the substrate.

16. The FET of claim 11 further comprising an inter-electrode dielectric between the shield electrode and the gate electrode in each trench, wherein the shield electrode is electrically connected to the gate electrode by an additional connection through the inter-electrode dielectric.

17. The FET of claim 11 wherein the non-active region includes a gate runner region extending through a middle portion of the die, the shield electrode and gate electrode extending out of each trench and into the gate runner region where the shield electrode and gate electrode are electrically connected together by the gate interconnect layer.

18. The FET of claim 11 wherein the non-active region includes a termination region extending along a perimeter of the die, the shield electrode and gate electrode extending out of each trench and into the termination region where the shield electrode and gate electrode are electrically connected together by the gate interconnect layer.

19. A field effect transistor (FET) comprising a plurality of trenches extending into a semiconductor region, each trench having a gate electrode and a shield electrode with an inter-electrode dielectric therebetween, wherein the shield electrode and the gate electrode are electrically connected together in a non-active region of the FET.

* * * * *